US012482750B2

(12) United States Patent
Kang et al.

(10) Patent No.: US 12,482,750 B2
(45) Date of Patent: Nov. 25, 2025

(54) POWER DISTRIBUTION NETWORK WITH BACKSIDE POWER RAIL

(71) Applicant: International Business Machines Corporation, Armonk, NY (US)

(72) Inventors: Tsung-Sheng Kang, Ballston Lake, NY (US); Koichi Motoyama, Clifton Park, NY (US); Oscar van der Straten, Guilderland Center, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 551 days.

(21) Appl. No.: 17/967,015

(22) Filed: Oct. 17, 2022

(65) Prior Publication Data

US 2024/0128191 A1    Apr. 18, 2024

(51) Int. Cl.
*H01L 23/528* (2006.01)
*H01L 21/768* (2006.01)
*H01L 23/522* (2006.01)
*H01L 23/532* (2006.01)

(52) U.S. Cl.
CPC .... *H01L 23/5286* (2013.01); *H01L 21/76804* (2013.01); *H01L 21/76831* (2013.01); *H01L 23/5226* (2013.01); *H01L 23/53295* (2013.01)

(58) Field of Classification Search
CPC .......... H01L 23/5286; H01L 21/76831; H10D 84/0149
USPC ......................................................... 257/621
See application file for complete search history.

(56) References Cited

U.S. PATENT DOCUMENTS

| 11,114,366 | B2 | 9/2021 | Liaw |
| 11,264,327 | B2 | 3/2022 | Chiang et al. |
| 11,276,643 | B2 | 3/2022 | Huang et al. |
| 2021/0202385 | A1 | 7/2021 | Huang et al. |
| 2021/0343712 | A1 | 11/2021 | Lin et al. |
| 2021/0359091 | A1* | 11/2021 | Hsu ................ H10D 30/6757 |
| 2022/0077138 | A1 | 3/2022 | Okubo |
| 2022/0231054 | A1 | 7/2022 | Okamoto et al. |

FOREIGN PATENT DOCUMENTS

WO    2021070367 A1    4/2021

* cited by examiner

*Primary Examiner* — Quoc D Hoang
(74) *Attorney, Agent, or Firm* — L. Jeffrey Kelly; Ryan, Mason & Lewis, LLP

(57) ABSTRACT

A semiconductor structure includes a backside power rail disposed in a backside dielectric layer, and dielectric spacer layers laterally extending inwardly from opposing sidewalls of the backside dielectric layer and on a portion of a bottom surface of the backside power rail.

20 Claims, 13 Drawing Sheets

POWER DISTRIBUTION NETWORK WITH BACKSIDE POWER RAIL

BACKGROUND

A field-effect transistor (FET) is a transistor having a source, a gate, and a drain, the operation of which depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

SUMMARY

In an illustrative embodiment, a semiconductor structure comprises a backside power rail disposed in a backside dielectric layer, and dielectric spacer layers laterally extending inwardly from opposing sidewalls of the backside dielectric layer and on a portion of a bottom surface of the backside power rail.

In accordance with another illustrative embodiment, a semiconductor structure comprises a backside power rail disposed in a first dielectric layer; and a second dielectric layer and a third dielectric layer each laterally extending inwardly from opposing sidewalls of the first dielectric layer and on a portion of a bottom surface of the backside power rail. The second dielectric layer and the third dielectric layer are disposed at an interface of the backside power rail and a shallow trench isolation region.

In accordance with yet another illustrative embodiment, a semiconductor structure comprises a backside dielectric layer disposed on a first dielectric layer, and a backside power rail disposed in the backside dielectric layer and the first dielectric layer. The first dielectric layer laterally extends inwardly beyond opposing sidewalls of the backside dielectric layer and on a portion of a bottom surface of the backside power rail.

8B is a side-cross-sectional view of a semiconductor structure at the first intermediate stage of fabrication illustrating formation of an ILD layer on the front end of the line structure and formation of a backside power rail trench, according to one or more illustrative embodiments.

Figure 9:
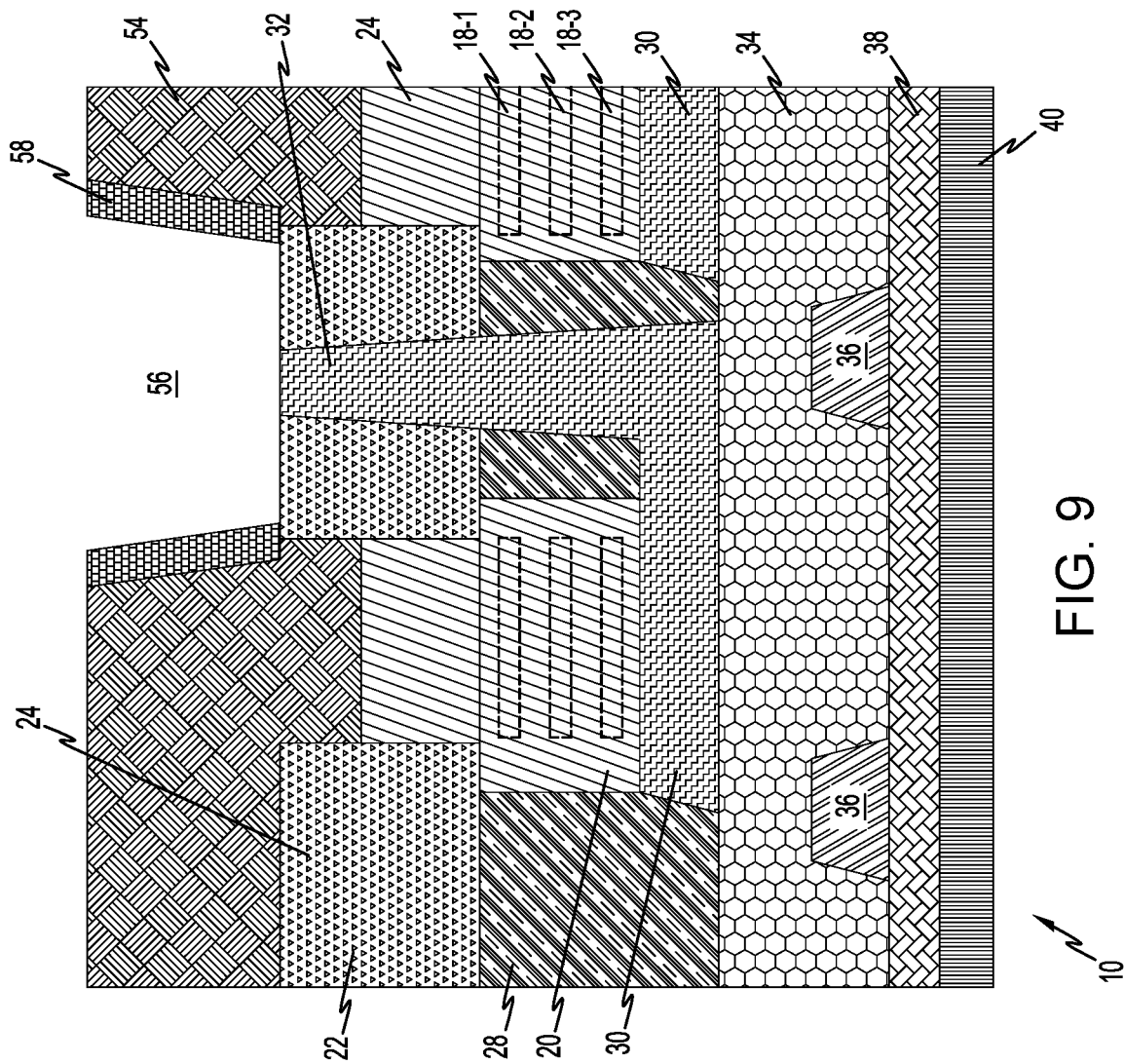

FIG. 9 is a side cross-sectional view of a semiconductor structure at a second intermediate stage of fabrication illustrating formation of the dielectric spacer within the backside power rail trench, according to one or more alternate illustrative embodiments.

Figure 10:
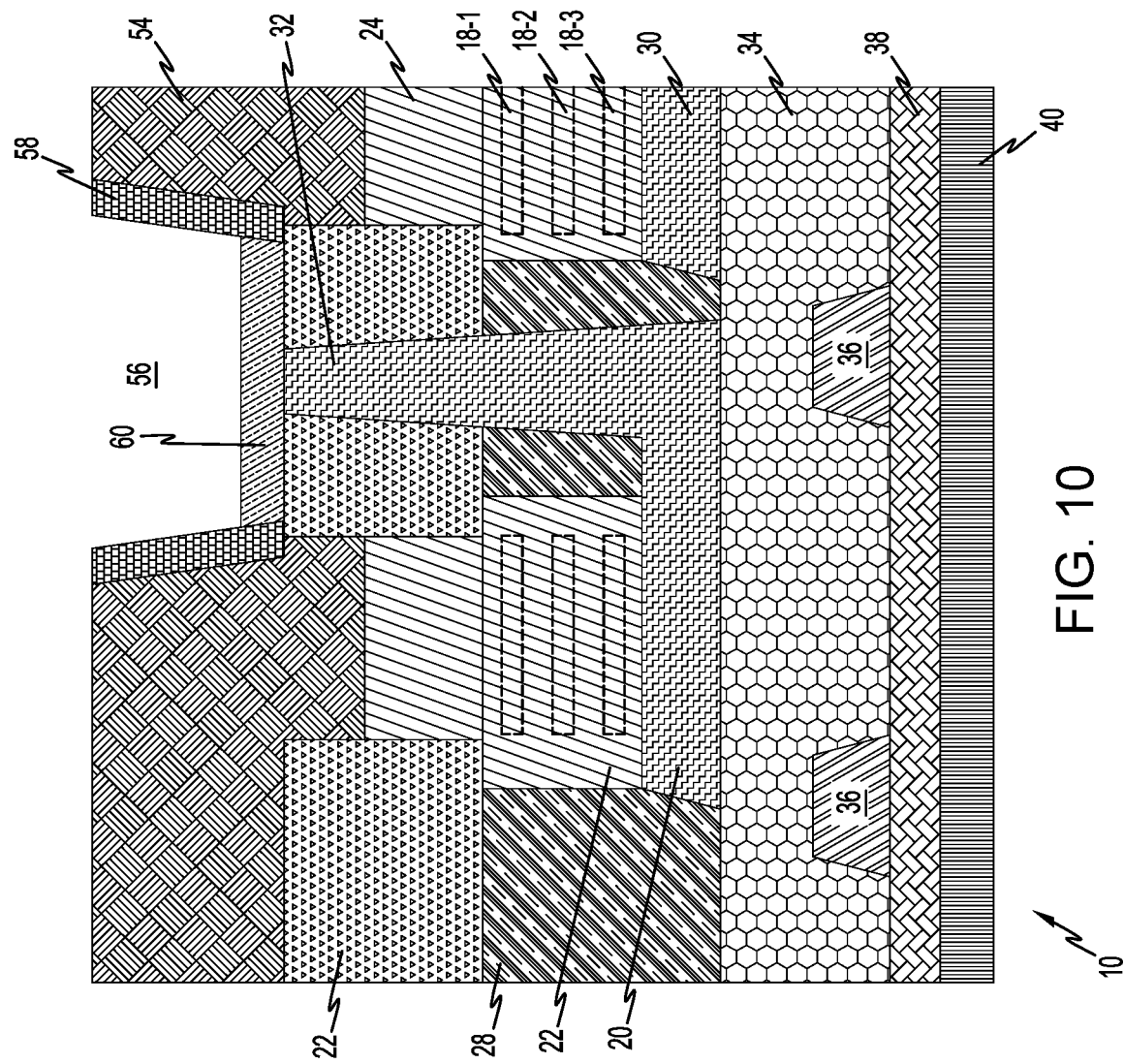

FIG. 10 is a side cross-sectional view of a semiconductor structure at a third intermediate stage of fabrication illustrating formation of an OPL layer within the backside power rad trench, according to one or more alternate illustrative embodiments.

Figure 11:
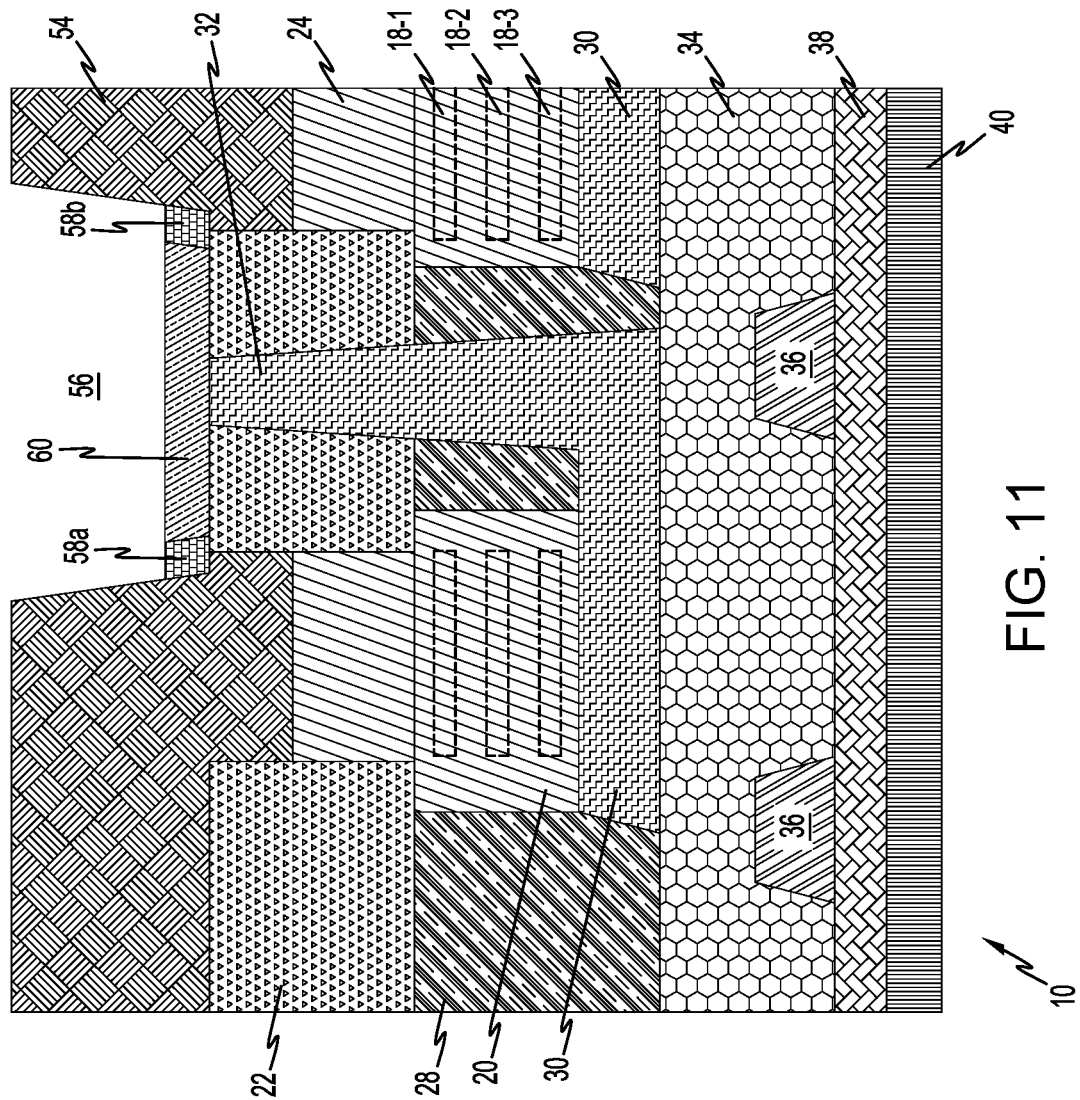

FIG. 11 is a side-cross-sectional view of a semiconductor structure at a fourth intermediate stage of fabrication illustrating removal of the spacer from within the backside power rail trench, according to one or more alternate illustrative embodiments.

Figure 12:
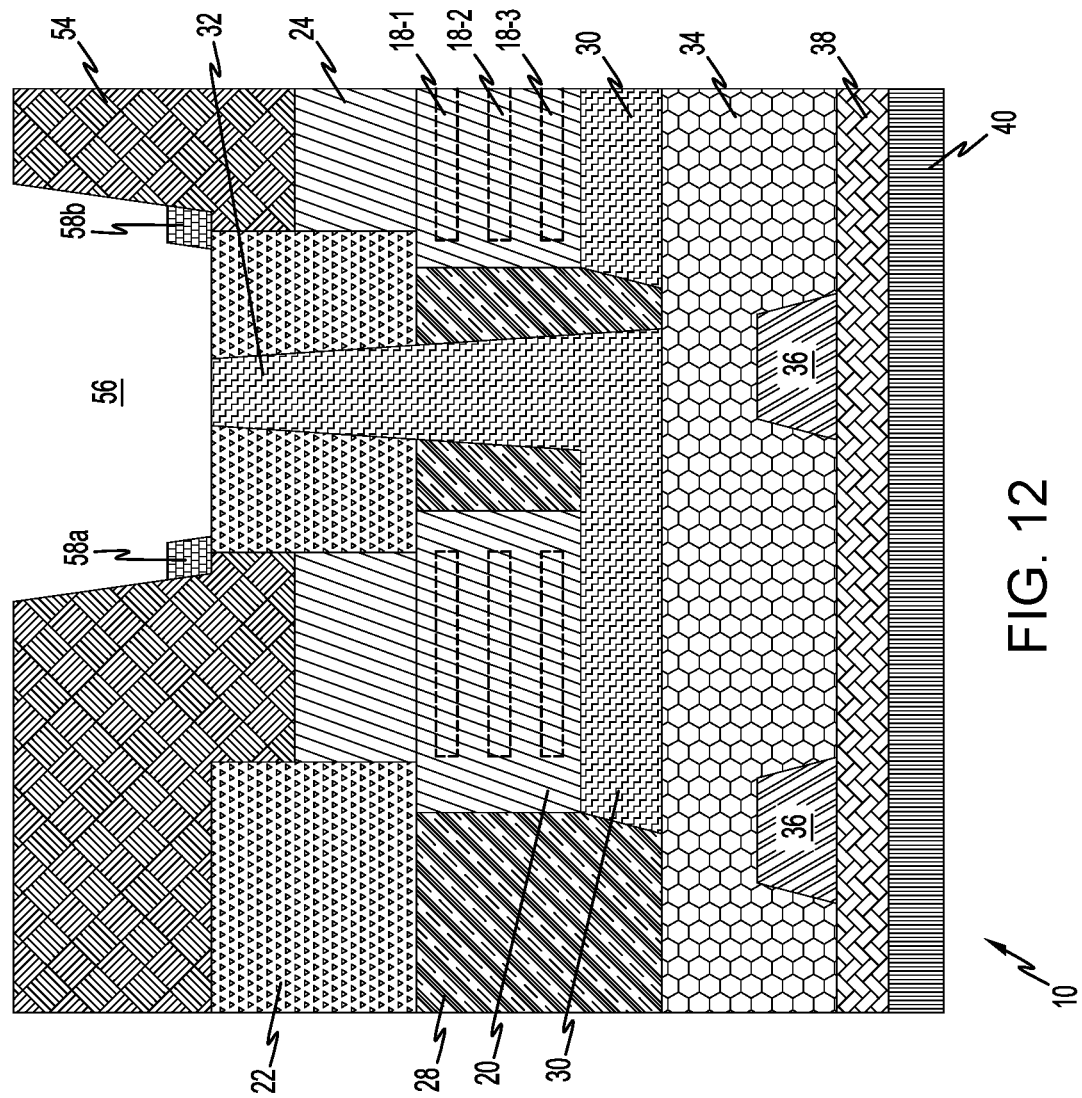

FIG. 12 is a side cross-sectional view of a semiconductor structure at a fifth intermediate stage of fabrication illustrating removal of the OPL layer within the backside power rail trench, according to one or more alternate illustrative embodiments.

Figure 13:
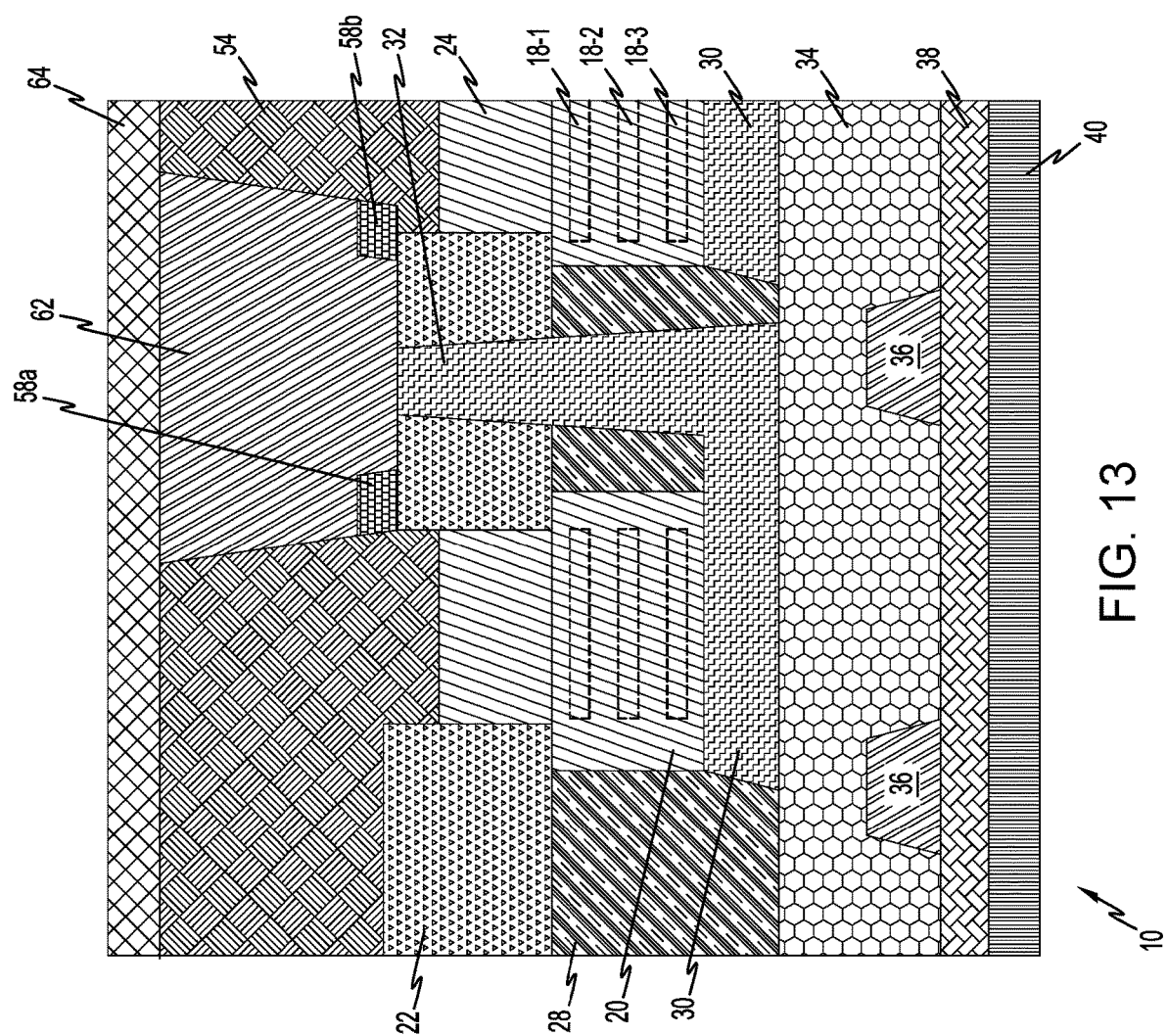

FIG. 13 is a side cross-sectional views of a semiconductor structure at a sixth intermediate stage of fabrication illustrating formation of the backside power rail within the backside power rail trench and formation of the backside power distribution network, according to one or more alternate illustrative embodiments.

DETAILED DESCRIPTION

Illustrative embodiments of the invention may be described herein in the context of illustrative methods for forming a semiconductor structure with a backside power rail having a shorter length to avoid contact with the silicon semiconductor substrate to prevent shorting, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

In general, the various processes used to form a semiconductor structure fall into four general categories, namely, film deposition, removal/etching, semiconductor doping and patterning/lithography. Deposition is any process that grows, coats, or otherwise transfers a material onto a semiconductor device. Available technologies include physical vapor deposition (PVD), chemical vapor deposition (CVD), electrochemical deposition (ECD), molecular beam epitaxy (MBE) and, more recently, atomic layer deposition (ALD) among others. Removal/etching is any process that removes material from the semiconductor structure. Examples include etch processes (either wet or dry), and chemical-mechanical planarization (CMP), and the like. Semiconductor doping is the modification of electrical properties by doping, for example, transistor sources and drains, generally by diffusion and/or by ion implantation. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to an underlying substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the substrate, for example, a wafer, is aligned to the previously formed patterns and slowly the conductors, insulators and selectively doped regions are built up to form the final device.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure is not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and trench capacitor fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including the package integrated circuit according to illustrative embodiments utilize a variety of individually known physical and chemical processes performed on a semiconductor (e.g., silicon) substrate, some of which are described in the immediately following paragraphs.

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Present semiconductor processing forms a backside power rail that is highly susceptible to shorting by being in contact with the silicon substrate. Illustrative embodiments provide methods and structures for overcoming the foregoing drawback by forming a backside power rail in a backside dielectric layer and having a dielectric spacer layer laterally extending inwardly from opposing sidewalls of the backside dielectric layer and on a portion of a bottom surface of the backside power rail to avoid contact with the silicon substrate. Illustrative embodiments also provide methods and structures for overcoming the foregoing drawback by forming a backside power rail in a backside dielectric layer disposed on a dielectric spacer layer with the dielectric spacer layer laterally extending inwardly beyond opposing sidewalls of the backside dielectric layer and on a portion of a bottom surface of the backside power rail to avoid contact with the silicon substrate.

In the discussion that follows, the semiconductor structure, which will incorporate one or more integrated circuit devices, will be referred to as the "semiconductor structure 10" throughout the various intermediate stages of fabrication, as represented in all the accompanying drawings.

Figure 1A:
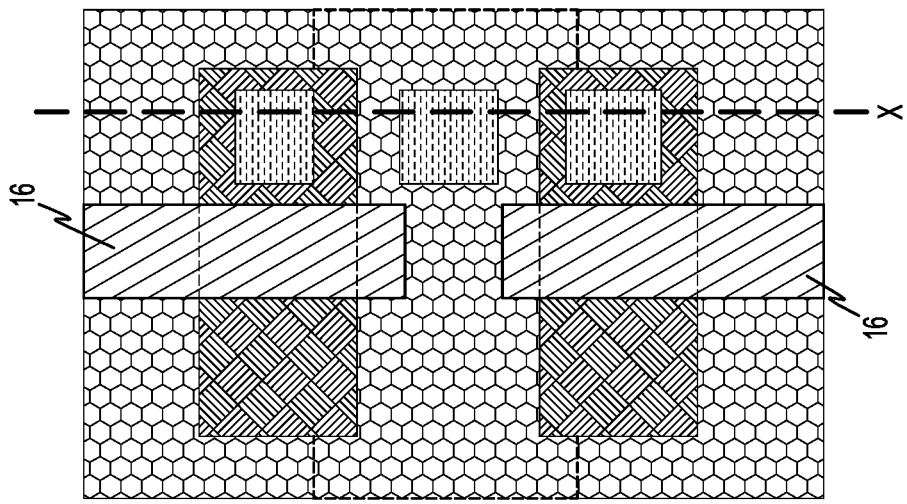
FIG. 1A is a top plan view of a semiconductor structure at a first intermediate stage of fabrication, according to one or more illustrative embodiments.
Figure 1B:
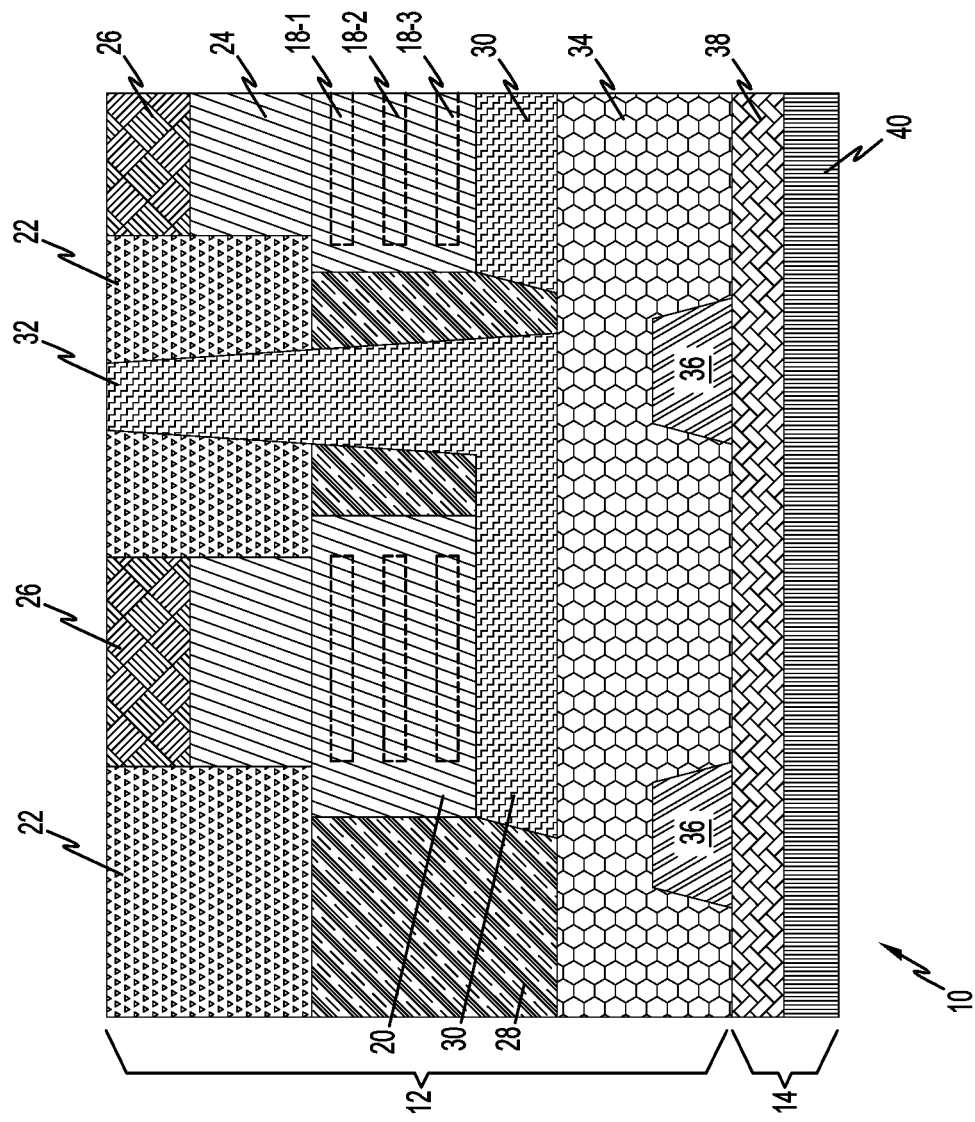
FIG. 1B is a side-cross-sectional view taken along the line X-X of FIG. 1A of the semiconductor structure at the first intermediate stage of fabrication, according to one or more illustrative embodiments.

FIGS. 1A and 1B schematically illustrate a first intermediate stage of fabrication of the semiconductor structure 10. During this stage, the FEOL structure 12 and the BEOL structure or interconnect 14 are formed and bonded together, and shown "flipped" with the FEOL structure 12 disposed above the BEOL structure 14. In illustrative embodiments, the FEOL structure 12 includes a semiconductor substrate 24 upon which the integrated circuit components will be formed. A portion of semiconductor substrate 24 is removed during processing of the semiconductor structure 10. The substrate 24 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 24 is silicon.

Through various FEOL processing steps not detailed in the present context, the FEOL structure 12 further includes one or more gates 16, nanosheet channel layers 18-1, 18-2 and 18-3 (collectively, nanosheet channel layers 18) upon which source/drain regions 20 are formed, grown or developed. The nanosheet channel layers 18 may be formed of silicon or another suitable material (e.g., a material similar to that used for the wafer). The nanosheet channel layers 18 are formed by suitable lithographic and etching processes. Although three nanosheets are shown, the number of nanosheets should not be considered limiting and any number are contemplated.

The source/drain regions 20 may be formed using epitaxial growth processes. The source/drain regions 20 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). In some embodiments, the epitaxy process comprises in-situ doping (dopants are incorporated in epitaxy material during epitaxy).

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

The FEOL structure 12 further includes shallow trench isolation (STI) regions 22. STI regions 22 may be formed of a dielectric material such as silicon dioxide ($SiO_2$), silicon oxycarbide (SiOC), silicon oxynitride (SiON), etc.

The FEOL structure 12 further includes interlayer dielectric (ILD) layers 26 and 28. The ILD layers 26 and 28 may independently be formed of any suitable dielectric material, such as $SiO_2$, SiOC, SiON, etc. FIGS. 1A and 1B further illustrate STI regions 22 and ILD layer 26 subsequent to being subjected to a chemical mechanical polishing (CMP) process.

A metal contact 30 is electrically connected to at least one of the source/drain regions 20. Suitable metals for metal contact include any conductive material such as, for example, tungsten (W), aluminum (Al), copper (Cu), cobalt (Co), nickel (Ni), titanium (Ti), ruthenium (Ru), molybdenum (Mo), or any other suitable conductive material. A via-to-backside power rail (VBPR) 32 extends to the metal contact 30 and can be of the same or different conductive metal as metal contact 30.

The FEOL structure 12 further includes backside power rail 34 and middle-of-the-line (MOL) contacts 36. As noted, the components of the FEOL structure 12 are processed through known semiconductor manufacturing processes identified hereinabove.

The back-end-of-line (BEOL) structure 14 includes BEOL interconnect 38 formed followed by bonding of the structure (e.g., the BEOL interconnect 38) to a carrier wafer 40. The BEOL interconnect 38 includes various BEOL interconnect structures. For example, BEOL interconnect 38 is a metallization structure that includes one or more metal layers disposed on a side of semiconductor structure 10 opposite of the side on which the backside BEOL metallization structure is disposed. The metal layers of the BEOL interconnect 38 each have metal lines for making interconnections to the semiconductor device. In illustrative embodiments, the BEOL interconnect 38 includes conductive interconnects which convey signals, provide power and ground for various electronic system components, and interconnect the devices in the FEOL structure 12.

The carrier wafer 40 may be formed of materials similar to that of the substrate 24, and may be formed over the BEOL interconnect 38 using a wafer bonding process. Bonding preferably takes place by a direct dielectric-to-dielectric bonding process, involving dielectric bonding layers deposited on the surfaces of the BEOL interconnect 38 and of the carrier wafer 40.

Figure 2:
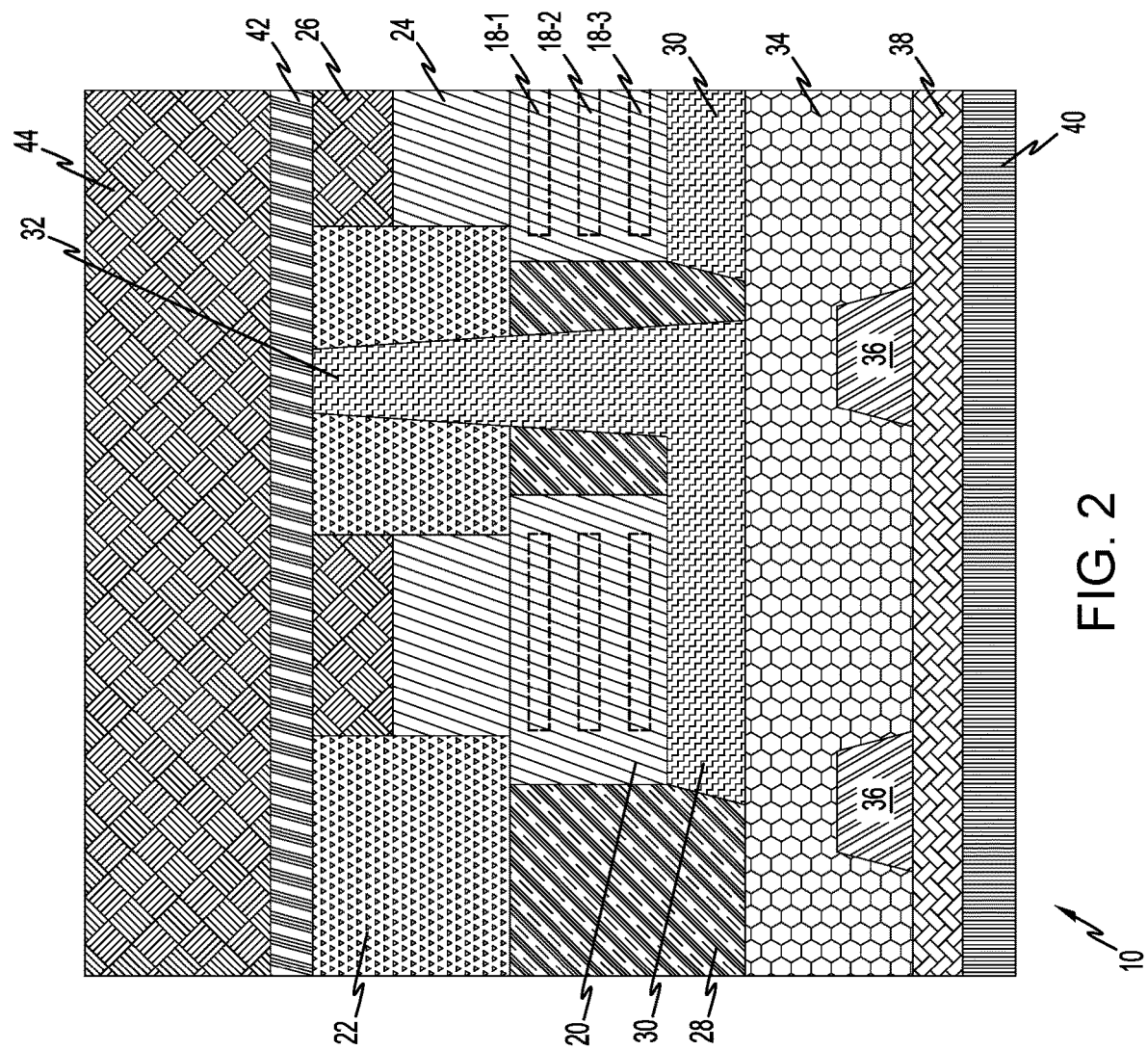
FIG. 2 is a side-cross-sectional view of the semiconductor structure at a second intermediate stage of fabrication illustrating formation of first and second ILD on the front end of the line structure, according to one or more illustrative embodiments.

FIG. 2 illustrates a second intermediate stage of fabrication of the semiconductor structure detailing initial phases of backside processing of semiconductor structure 10. During this stage, a first ILD layer 42 is deposited or formed on the FEOL structure 12 and a second ILD layer 44 is deposited or formed on the first ILD layer 42 through suitable deposition techniques such as ALD, CVD, etc. Each of the first and second ILD layers 42, 44 may be subject to one or more grinding or polishing processes. The first and second ILD layers 42, 44 may be formed of any suitable dielectric material, such as Sift, SiOC, SiON, etc. In illustrative embodiments, first ILD layer 42 comprises a first material and second ILD layer 44 comprises a second material different from the first material.

Figure 3:
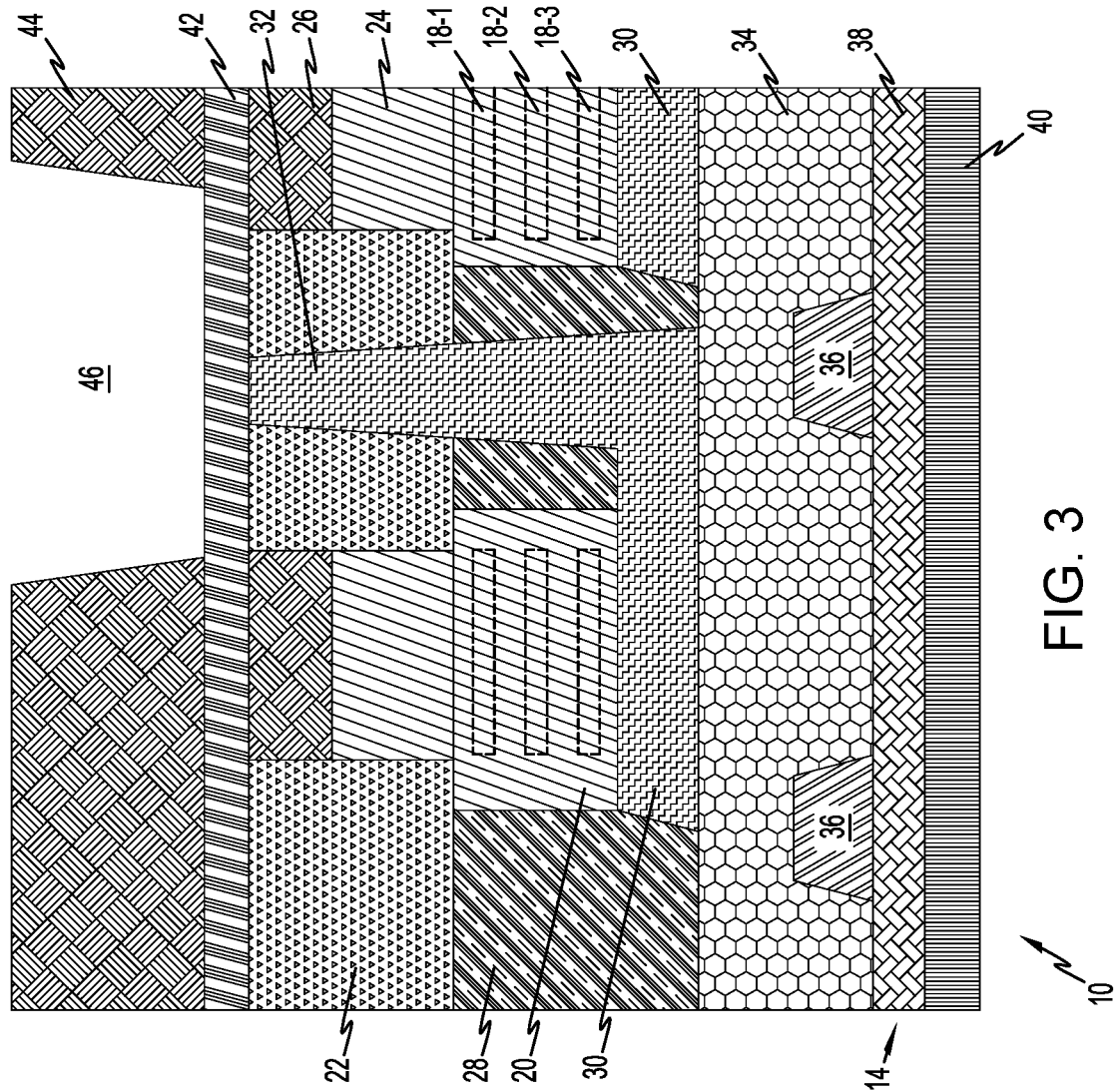
FIG. 3 is a side-cross-sectional view of the semiconductor structure at the third intermediate stage of fabrication illustrating formation of a backside power rail trench into the second MD according to one or more illustrative embodiments.

FIG. 3 illustrates a third intermediate stage of fabrication of the semiconductor structure 10. Through known lithographic and etching processes, a backside power rail (BPR) trench 46 is formed to extend through the second ILD layer 44 and terminate at the juncture of the first ILD layer 42. The etching process is controlled to form a tapered BPR trench 46 having a width which tapers so as to increase in dimension away from the FEOL structure 12. This dimension is merely illustrative and other dimensions are also contemplated.

Figure 4:
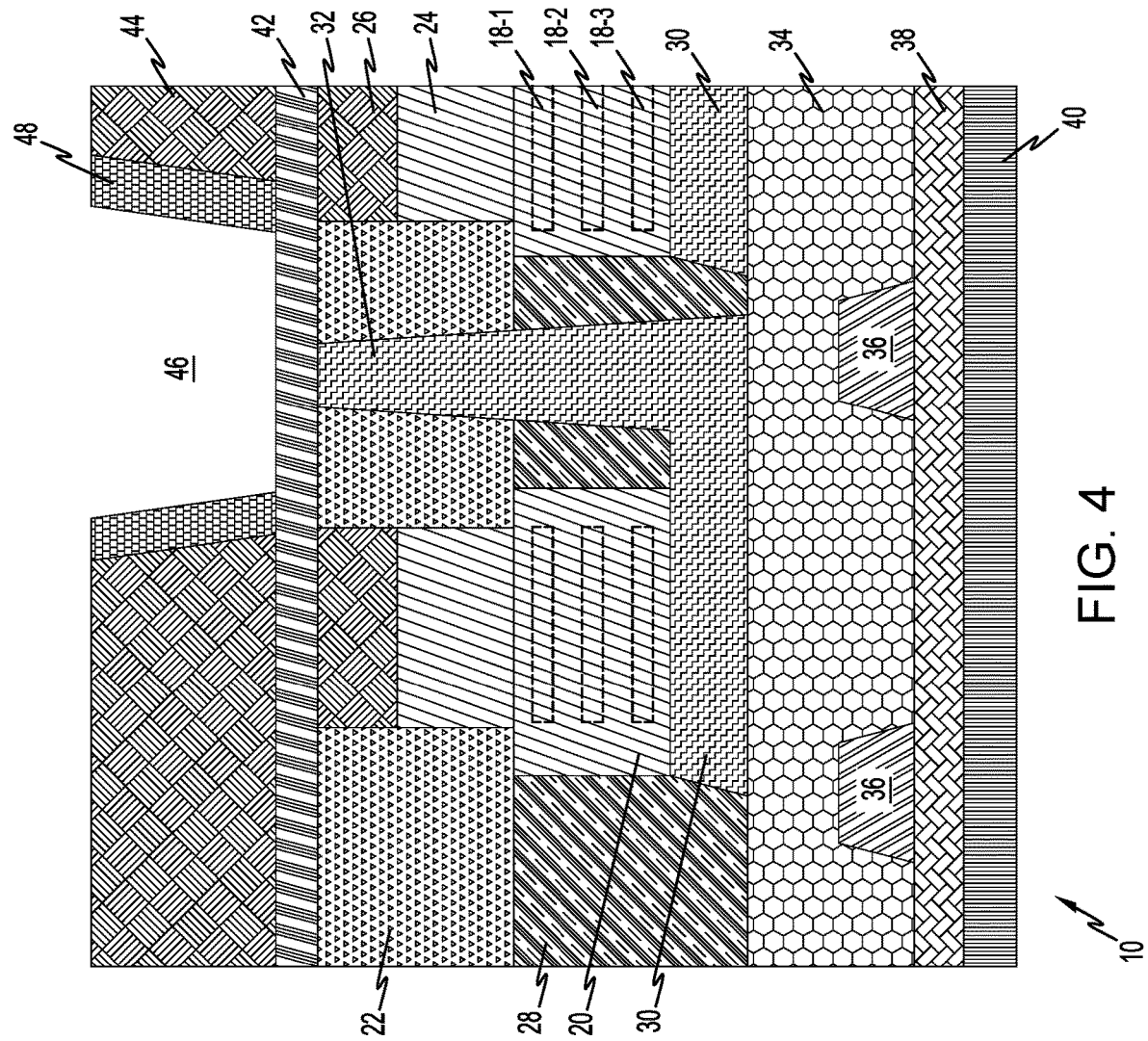
FIG. 4 is a side-cross-sectional view of the semiconductor structure at a fourth intermediate stage a fabrication illustrating formation of a dielectric spacer within the backside power rail trench within the second dielectric layer, according to one or more illustrative embodiments.

FIG. 4 illustrates a fourth intermediate stage of fabrication of the semiconductor structure 10. During this stage, a dielectric fill material is deposited within the BPR trench 46 and is subjected to a lithographic and suitable etching process including, for example, an isotropic etching process, a non-isotropic etching process, or a directional etching process, to selectively remove the dielectric fill to form a sidewall spacer 48 along the sidewalls of the BPR trench 46. The dielectric fill material may be any suitable material including, for example, silicon nitride, silicon dioxide, SiCN, SiBCN, SiON, etc.

Figure 5:
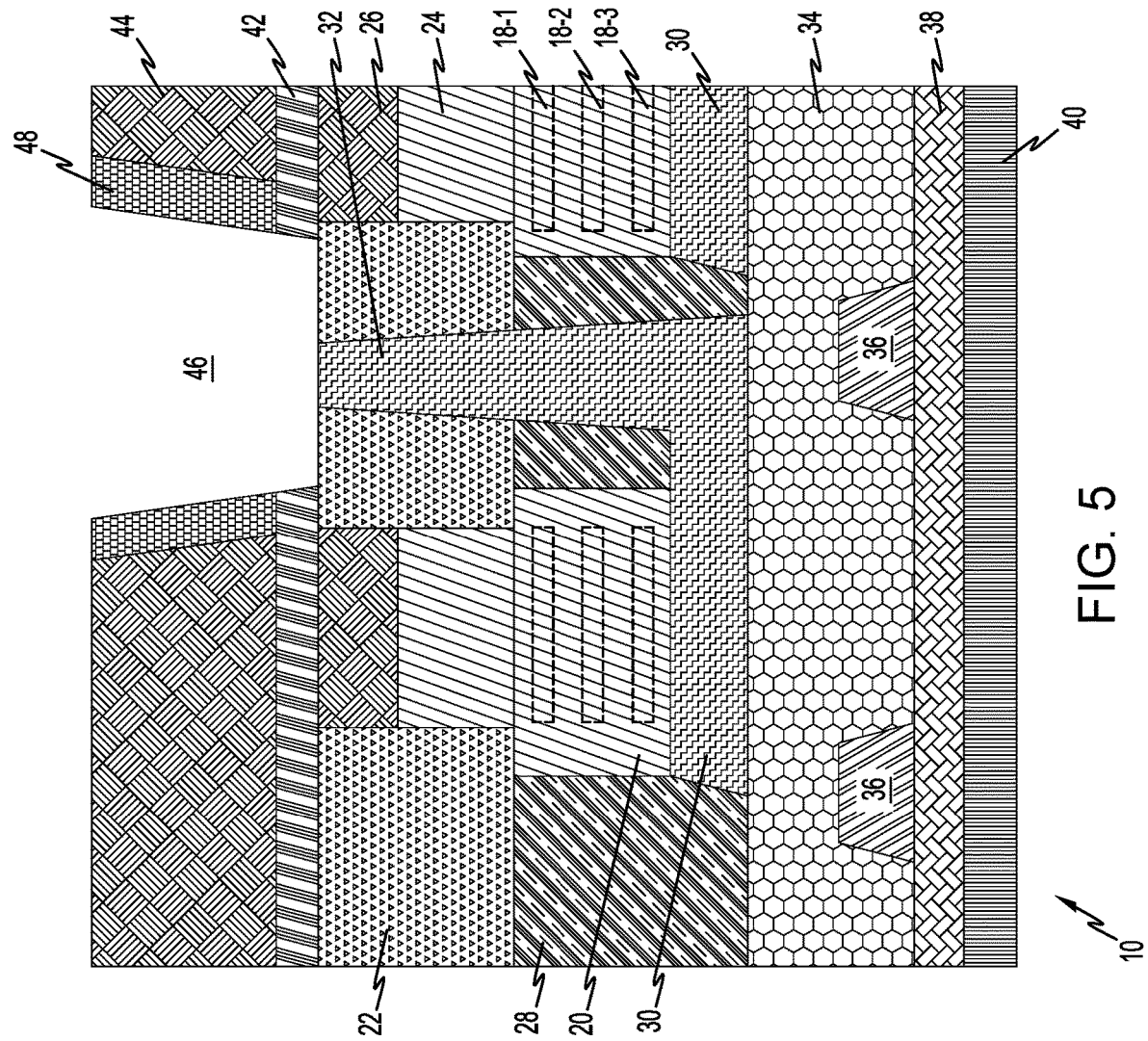
FIG. 5 is a side-cross-sectional view of the semiconductor structure at a fifth intermediate stage of fabrication illustrating removal of the first ILD within the backside power rail trench, according to one or more illustrative embodiments.

FIG. 5 illustrates a fifth intermediate stage of fabrication of the semiconductor structure 10. During this stage, the exposed portion of the first ILD layer 42 within the BPR trench 46 is removed via one or more suitable lithographic and selective etching processes such as reactive ion etching (ME) to expose a top surface of VBPR 32 and STI regions 22.

Figure 6:
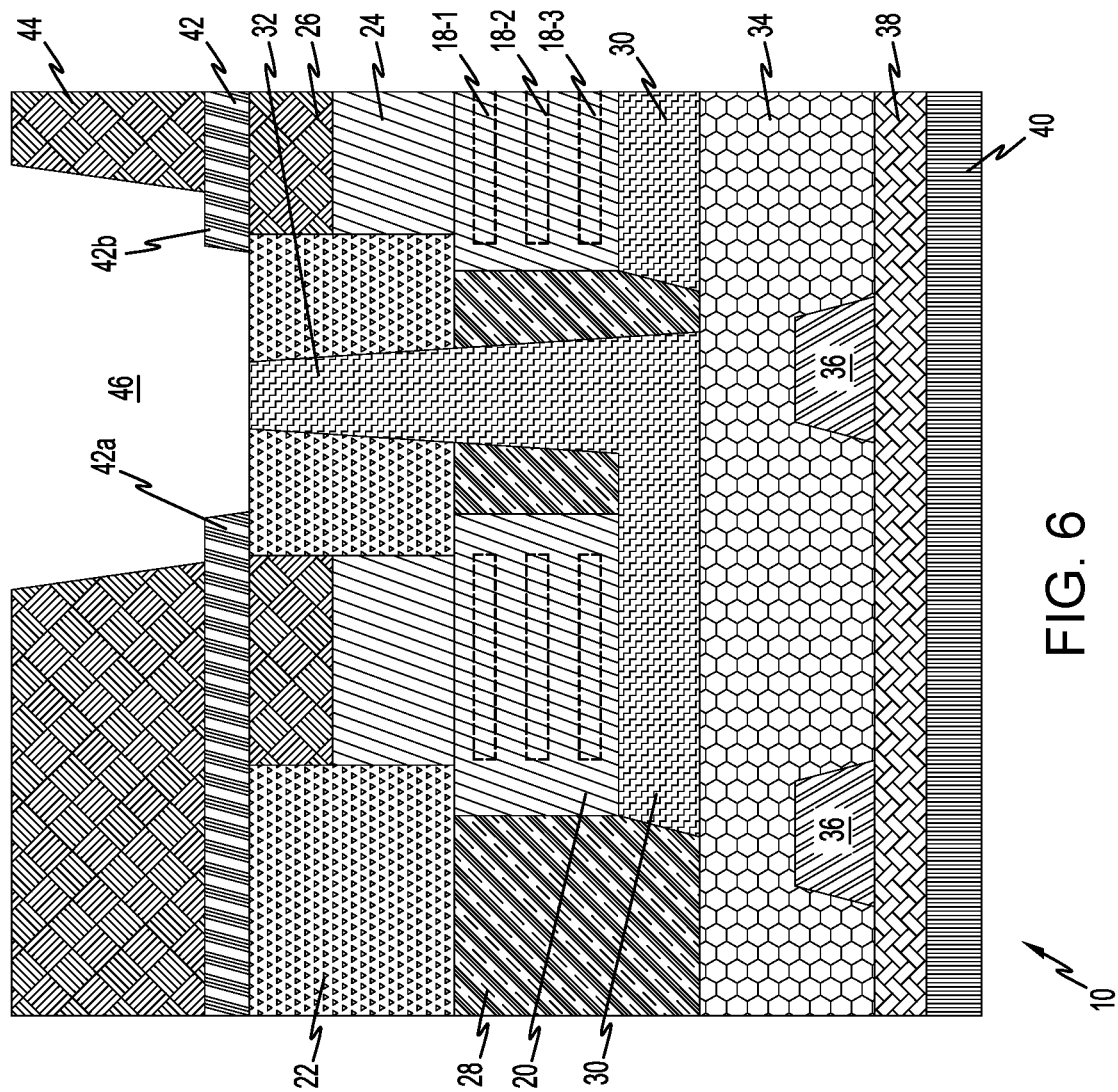
FIG. 6 is a side-cross-sectional view of the semiconductor structure at a sixth intermediate stage of fabrication illustrating removal of the dielectric spacer from within the backside power rail trench, according to one or more illustrative embodiments.

FIG. 6 illustrates a sixth intermediate stage of fabrication of the semiconductor structure 10. During this stage, the sidewall spacer 48 along the vertical walls of the BPR trench 46 is removed via one or more suitable lithographic and selective etching processes such as ME. The etching process is selective to the material of the first ILD layer 42 thereby leaving ILD spacer layers 42a, 42b of the first ILD layer 42 extending beyond sidewalls of second ILD layer 44 and within the BPR trench 46, i.e., on opposing sides of the BPR trench 46.

Figure 7:
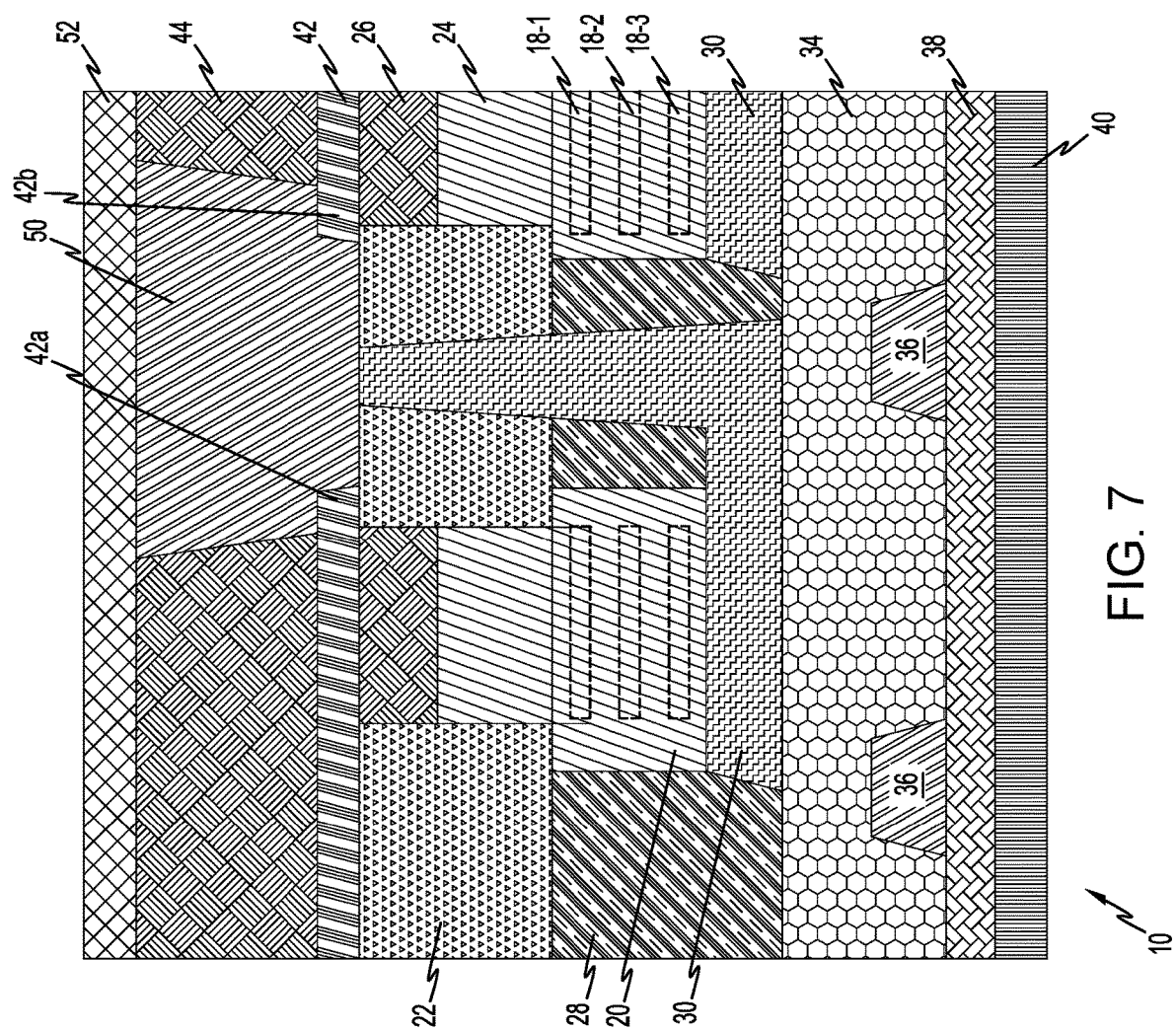
FIG. 7 is a side cross-sectional view of the semiconductor structure at a seventh intermediate stage of fabrication illustrating formation of the backside power rail and formation of the backside power distribution network, according to one or more illustrative embodiments.

FIG. 7 illustrates a seventh intermediate stage of fabrication of the semiconductor structure 10. During this stage, semiconductor structure 10 is subjected to one or more metallization processes. In one illustrative embodiment, a conductive metal is deposited into the BPR trench 46 to form a BPR or contact 50 in communication with the VBPR 32. Suitable conductive metals include any conductive material such as, for example, tungsten (W), aluminum (Al), copper (Cu), cobalt (Co), nickel (Ni), titanium (Ti), ruthenium (Ru), molybdenum (Mo), or any other suitable conductive material. In various embodiments, the conductive metal can be deposited using any conventional deposition process such as ALD, CVD, PVD, and/or plating. In illustrative embodiment, ILD spacer layers 42a, 42b are disposed at an interface of the BPR 50 and STI regions 22.

Thereafter, or in conjunction therewith, a backside power delivery network (BSPDN) 52 is formed on the backside of the semiconductor structure. The BSPDN 52 also referred to as a power distribution network, in some embodiments, includes a plurality of conductive segments supported and electrically separated via one or more insulation layers for power and signal transmission to the FEOL structure 12 and the BEOL structure 14. In illustrative embodiments, the BSPDN 52 is a combination of conductive segments arranged in a grid or mesh structure including one or more power lines or contacts. The BSPDN 52 may be fabricated utilizing known lithographic, etch, deposition, CMP and metallization processes.

With reference again to FIG. 7, the presence of ILD spacer layers 42a, 42b of the first ILD layer 42 within the lower corners of BPR 50 isolates the BPR 50 from the substrate 24 and nanosheet channel layers 18 (comprising silicon) adjacent the source/drain regions 20. This minimizes the potential of shorting between the BPR 50 and the underlying adjacent components including, for example, the nanosheet channel layers 18 and/or source/drain regions 20. The use of ILD spacer layers 42a, 42b advantageously allows the above-mentioned isolation effect at a minimal cost and minimal reduction of cross-section area inside the BPR 50. Depending on the desired application, the size of ILD spacer layers 42a, 42b can be adjusted to obtain the appropriate tradeoff between isolation effect and metallization cross-section.

Figure 8A:
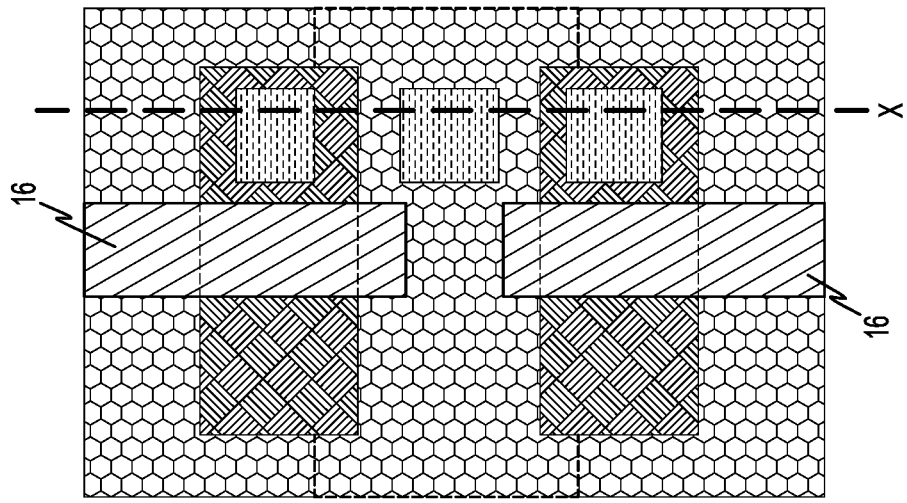
FIG. 8A is a top plan view of a semiconductor structure at a first intermediate stage of fabrication, according to one or more alternate illustrative embodiments.
Figure 8B:
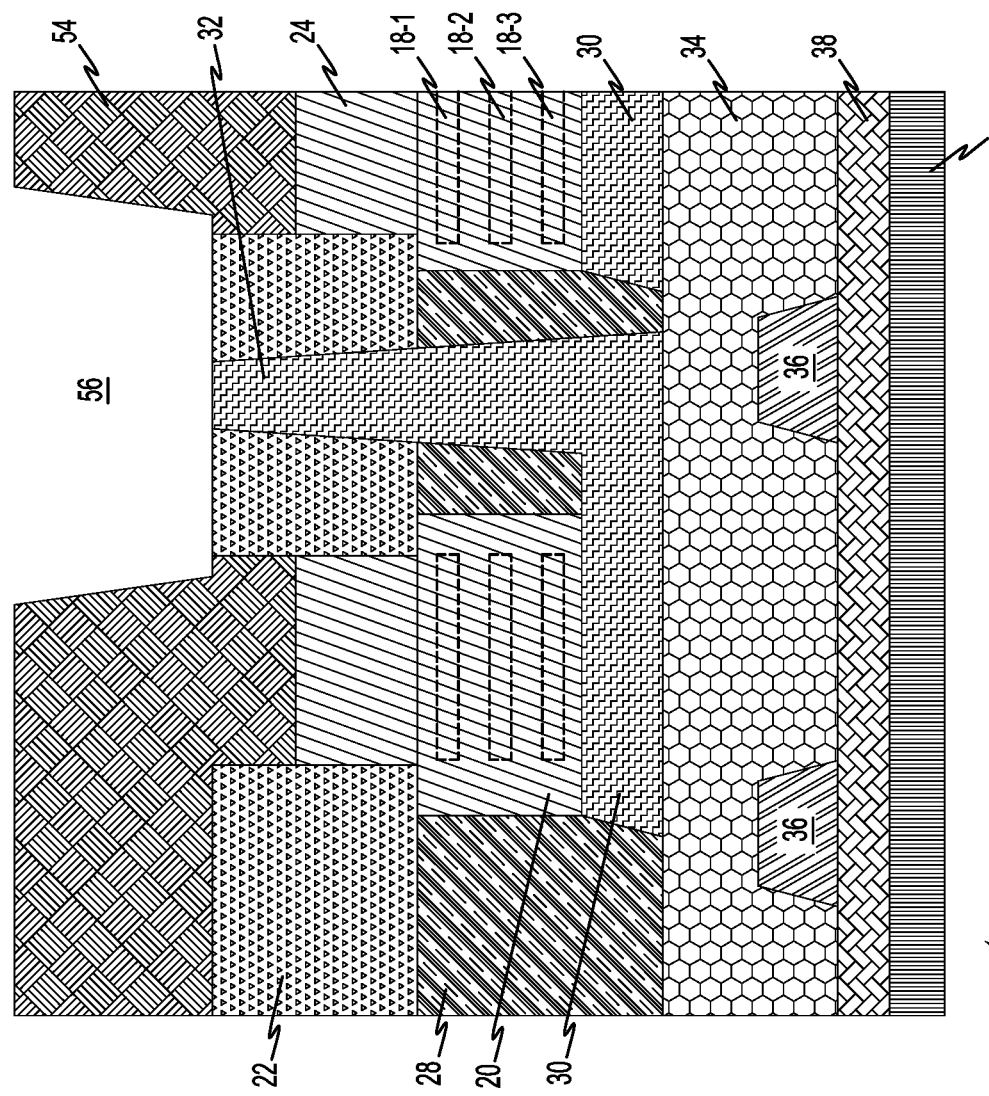

FIGS. 8A and 8B illustrate an alternate illustrative embodiment of semiconductor structure 10 at a first intermediate stage of fabrication. During this stage, an ILD layer 54 is deposited or formed on the back end of the semiconductor structure 10, i.e., on the FEOL structure 12. A BPR trench 56 is formed in the ILD layer 54 via one or more lithographic and etching processes to expose the upper surface of the STI regions 22 and the VBPR 32. ILD layer 54 can be of any material similar to second ILD layer 44 discussed above.

FIG. 9 illustrates a second intermediate stage of fabrication of the semiconductor structure 10. During this stage, a dielectric fill material is deposited within the BPR trench 56 and is subjected to a lithographic and suitable etching process including, for example, an isotropic etching process, a non-isotropic etching process, or a directional etching process, to remove the dielectric fill material to form a sidewall spacer 58 laterally extending inwardly from opposing sidewalls of the ILD layer 54 and on a portion of a bottom surface of the STI regions 22. The dielectric fill material may be any suitable material as sidewall spacer 48 discussed above.

FIG. 10 illustrates a third intermediate stage of fabrication of the semiconductor structure 10. During this stage, an organic planarization layer (OPL) 60 is deposited from, for example, a solution, by any conventional deposition process onto the semiconductor structure 10 within the BPR trench 56. The OPL 60 is subjected to patterning and/or etching processes to form an OPL 60 at the base of the BPR trench 56 on the STI regions 22 and VBPR 32.

OPL 60 can be composed of a flowable organic material such as, for example, a spin-on-carbon (SOC). In illustrative embodiments, OPL 60 is self-leveling and can achieve planarization over the surface topography without the use of etching, CMP, or other conventional planarization techniques. In illustrative embodiments, OPL 60 may require multiple deposition processes, etching processes or optionally a CMP process to planarize the OPL 60.

FIG. 11 illustrates a fourth intermediate stage of fabrication of the semiconductor structure 10. During this stage, sidewall spacer 58 along the vertical walls of the BPR trench 56 is removed via one or more suitable lithographic and selective etching processes such as a dry or wet etch. The etching process is selective to leave dielectric spacer layers 58a, 58b of sidewall spacer 58 extending within the BPR trench 56, i.e., on opposing sides of ILD layer 54 in the BPR trench 56. In illustrative embodiments, ILD layer 54 comprises a first material and dielectric spacer layers 58a, 58b comprises a second material different from the first material.

FIG. 12 illustrates a fifth intermediate stage of fabrication of the semiconductor structure 10. During this stage, the remaining OPL 60 is removed via an ash etching process. The etching material can be an oxygen ash or a nitrogen or hydrogen-based chemistry including, e.g., nitrogen gas or hydrogen gas, or a combination thereof. The ash etching process removes the OPL 60 with little or no gouging of the underlying components of the semiconductor structure 10 and the dielectric spacer layers 58a, 58b of sidewall spacer 58. Subsequent to the removal of the OPL 60, the VBPR 32 and the STI regions 22 are exposed and the dielectric spacer layers 58a, 58b remain intact.

FIG. 13 illustrates a sixth intermediate stage of fabrication of the semiconductor structure 10. During this stage, the semiconductor structure 10 is subjected to one or more metallization processes. In an illustrative embodiment, a conductive metal is deposited into the BPR trench 56 to form a BPR or contact 62 in communication with the VBPR 32. The conductive metal can be any of those discussed above. Thereafter, or in conjunction therewith, a BSPDN 64 is formed on the backside of the semiconductor structure 10. The BSPDN 64 also referred to as a power distribution network, in some embodiments, may be similar to the that described hereinabove in connection with the embodiments of FIGS. 1-7. The presence of dielectric spacer layers 58a, 58b within the lower corners of the BPR 62 isolates the BPR 62 from the substrate 24 and nanosheet channel layers 18 (comprising silicon) adjacent the source/drain regions 20. This minimizes the potential of shorting between the BPR 62 and the underlying adjacent components including, for example, the nanosheet channel layers 18 and/or source/drain regions 20. As noted, the dielectric spacer layers 58a, 58b permit the use of a VBPR 32 having a length and a reduced aspect ratio relative to conventional structures, and improves metallization and component profile.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a backside power rail disposed in a backside dielectric layer; and
dielectric spacer layers laterally extending inwardly from opposing sidewalls of the backside dielectric layer and on a portion of a bottom surface of the backside power rail;
wherein the backside power rail is disposed on a shallow trench isolation region.

2. The semiconductor structure according to claim 1, wherein a portion of a bottom surface of the backside dielectric layer extends below the bottom surface of the backside power rail.

3. The semiconductor structure according to claim 2, wherein the portion of the bottom surface of the backside dielectric layer extending below the bottom surface of the backside power rail is disposed on a semiconductor substrate.

4. The semiconductor structure according to claim 1, further comprising a via-to-backside-power rail connected to the bottom surface of the backside power rail between the dielectric spacer layers.

5. The semiconductor structure according to claim 4, wherein a portion of the via-to-backside-power rail connected to the bottom surface of the backside power rail is disposed in the shallow trench isolation region.

6. The semiconductor structure according to claim 5, wherein the dielectric spacer layers are disposed at an interface of the backside power rail and the shallow trench isolation region.

7. The semiconductor structure according to claim 1, wherein the backside dielectric layer comprises a first material and the dielectric spacer layers comprise a second material different from the first material.

8. The semiconductor structure according to claim 1, further comprising a backside power distribution network disposed on the backside power rail and the backside dielectric layer.

9. A semiconductor structure, comprising:
a backside power rail disposed in a backside dielectric layer; and a first dielectric layer and a second dielectric layer each laterally extending inwardly from opposing sidewalls of the backside dielectric layer and on a portion of a bottom surface of the backside power rail;

wherein the first dielectric layer and the second dielectric layer are disposed at an interface of the backside power rail and a shallow trench isolation region.

10. The semiconductor structure according to claim 9, further comprising a via-to-backside-power rail connected to the bottom surface of the backside power rail the first dielectric layer and the second dielectric layer.

11. The semiconductor structure according to claim 10, wherein a portion of the via-to-backside-power rail connected to the bottom surface of the backside power rail is disposed in the shallow trench isolation region.

12. The semiconductor structure according to claim 9, wherein a portion of a bottom surface of the backside dielectric layer extends below the bottom surface of the backside power rail.

13. The semiconductor structure according to claim 12, wherein the portion of the bottom surface of the backside dielectric layer extending below the bottom surface of the backside power rail is disposed on a semiconductor substrate.

14. The semiconductor structure according to claim 13, wherein the semiconductor substrate is a silicon semiconductor substrate.

15. The semiconductor structure according to claim 9, wherein the backside dielectric layer comprises a first material and the first dielectric layer and the second dielectric layer comprise a second material different from the first material.

16. The semiconductor structure according to claim 9, further comprising a backside power distribution network disposed on the backside power rail and the backside dielectric layer.

17. A semiconductor structure, comprising:
a backside dielectric layer disposed on a first dielectric layer; and
a backside power rail disposed in the backside dielectric layer and the first dielectric layer;
wherein the first dielectric layer laterally extends inwardly beyond opposing sidewalls of the backside dielectric layer and on a portion of a bottom surface of the backside power rail.

18. The semiconductor structure according to claim 17, further comprising a via-to-backside-power rail connected to the bottom surface of the backside power rail between the first dielectric layer laterally extends inwardly beyond opposing sidewalls of the first dielectric layer.

19. The semiconductor structure according to claim 18, wherein a bottom surface of the first dielectric layer and the bottom surface of the backside power rail are contiguous.

20. The semiconductor structure according to claim 19, wherein the first dielectric layer is disposed at an interface of a shallow trench isolation region and a second dielectric layer.

* * * * *